United States Patent [19]
Takahashi

[11] Patent Number: 5,877,642
[45] Date of Patent: Mar. 2, 1999

[54] LATCH CIRCUIT FOR RECEIVING SMALL AMPLITUDE SIGNALS

[75] Inventor: Hiroyuki Takahashi, Tokyo, Japan

[73] Assignee: NEC Corporation, Tokyo, Japan

[21] Appl. No.: 751,612

[22] Filed: Nov. 18, 1996

[30] Foreign Application Priority Data

Nov. 17, 1995 [JP] Japan .................................. 6-323627

[51] Int. Cl.[6] .................................................. H03K 3/286
[52] U.S. Cl. .......................... 327/207; 327/203; 327/433; 326/126
[58] Field of Search ..................................... 327/202, 203, 327/207, 208–212, 218, 432, 433, 324, 563; 326/66, 67, 77, 69, 126, 110, 109

[56] References Cited

U.S. PATENT DOCUMENTS

| | | | |
|---|---|---|---|
| 4,958,094 | 9/1990 | Ishii et al. ................................ | 327/432 |
| 4,970,406 | 11/1990 | Fitzpatrick et al. ................... | 307/272.1 |
| 4,992,681 | 2/1991 | Urakawa et al. ........................ | 307/475 |
| 5,148,061 | 9/1992 | Hsueh et al. ............................. | 307/475 |
| 5,216,298 | 6/1993 | Ohba et al. ............................... | 326/66 |

FOREIGN PATENT DOCUMENTS

| | | |
|---|---|---|
| 0 501 085 | 9/1992 | European Pat. Off. . |
| 0 627 819 | 12/1994 | European Pat. Off. . |
| 63-87014 | 4/1988 | Japan . |
| 3-201719 | 9/1991 | Japan . |
| 5-48402 | 2/1993 | Japan ..................................... 327/202 |

OTHER PUBLICATIONS

Masataka Matsui et al., "Digest of Technical Papers", *1989 IEEE International Solid–State Circuits Conference*, pp. 38 and 39.

*Primary Examiner*—Timothy P. Callahan
*Assistant Examiner*—Eunja Shin
*Attorney, Agent, or Firm*—Young & Thompson

[57] ABSTRACT

The latch circuit having an input stage supplied with an input signal and, when activated, producing an output signal responsive to the input signal, and an latching stage coupled to the input stage and, when activated, holding a level of the output signal, the input stage including a pair of bipolar transistors Q1, Q2 coupled in a differential form, the latching stage including a pair of insulated gate field effect transistors M1, M2 coupled in a differential form.

5 Claims, 8 Drawing Sheets

LATCH CIRCUIT FOR RECEIVING SMALL AMPLITUDE SIGNALS

BACKGROUND OF THE INVENTION

1. Field of the Invention

The present invention is related to a latch circuit, and more particularly to a latch circuit receiving small amplitude signals.

2. Description of the Related Art

A circuit using a bipolar (BipTr) is employed conventionally in a semiconductor logic circuit aimed mainly at high speed operation, in which a small amplitude signal represented by an emitter coupled logic (ECL) level is employed in a latch circuit using the small amplitude signal as an input.

Figure 8:
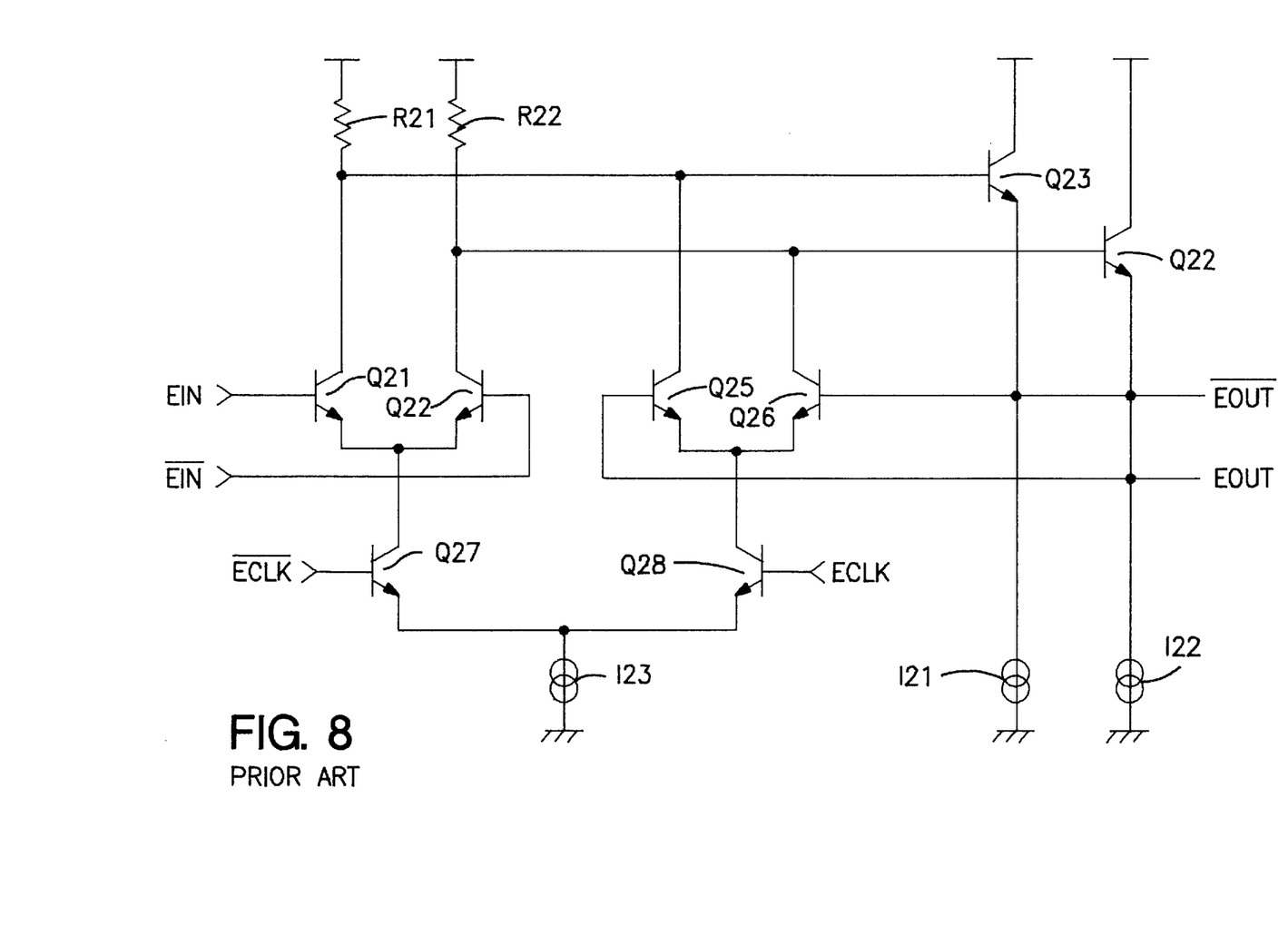
FIG. 8 is a circuit diagram showing the configuration of the conventional latch circuit.

Referring to FIG. 8 an example of conventional latch circuit will be described. Collectors of BipTrs Q21 and Q22 which input complementary input signals EIN and EIN/ (hereinafter, the symbol "/" denotes the inversion) as their base inputs and having their emitters are connected in common, are connected to respective one side ends of resistors R21 and R22 with the respective other ends connected to the highest power supply voltage (Vcc) as well as to the bases of BipTrs Q23 and Q24 constituting an emitter follower circuit.

The emitters of BipTrs Q23 and Q24 are connected to current sources I21 and I22, respectively, and are made to be output signals EOUT and EOUT/, and the emitter potentials of the BipTrs Q23 and Q24 are input to the bases of BipTrs Q26 and Q25, respectively.

The collectors of the BipTrs Q25 and Q21, and of Q26 and Q22 are respectively connected in common. Common emitter of a current switch consisting of the BipTrs Q21 and Q22 is connected to the collector of a BipTr Q27, common emitter of a current switch consisting of the BipTrs Q25 and Q26 is connected to the collector of a BipTr Q28, common emitter of a current switch consisting of the BipTrs Q27 and Q28 is connected to a current source I23, and their bases are receiving latch switching signals ECLK and ECLK/.

Next, the operation of the circuit having a through state and a latch state shown in FIG. 8 will be described.

When the latch switching signal ECLK/ is at an active level (a high level) and the ECLK is at an inactive level (a low level), the BipTr Q27 is turned on and the BipTr Q28 is turned off, the current switch consisting of the BipTrs Q25 and Q26 is deactivated, and the current of the current source I23 is supplied to the current switching consisting of the BipTrs Q21 and Q22.

In this case, when data inputs EIN and EIN/ are input, one of the BipTrs Q21 and Q22 for which a high level signal is input as a base input is turned on (is in conductive state), the other for which a low level signal is input as the base input is turned off (is in non-conductive state). Potential drop due one of load resistors R21 and R22 connected to the BipTr in on-state is increased causing its collector potential to go to the low level, and potential drop of the resistor connected to the BipTr in the off-state is decreased (or not decreased) bringing its collector potential to the high level. In this way, a potential difference is generated in the collector potentials of the BipTrs Q21 and Q22, which is received by the emitter follower of the BipTrs Q23 and Q24 and is output as a potential difference of the outputs EOUT and EOUT/.

This condition is the through state of the latch circuit so that it operates in a manner similar to a general ECL logic buffer.

In the latch state, the latch switching signal ECLK/ goes to the low level and the ECLK goes to the high level, the current switch consisting of the BipTrs Q25 and Q26 is activated and the current switch consisting of the BipTrs Q21 and Q22 is deactivated.

The collector of the BipTr Q25 which inputs by feedback the output signal EOUT to the base, out of the BipTrs Q25 and Q26 constituting a current switch, is connected to the collector of the BipTr Q21 and its signal is input to the base of the BipTr Q23 constituting an emitter follower circuit which outputs the output signal EOUT/ from the emitter. The collector of the BipTr Q26 which inputs by feedback the output signal EOUT to the base is connected to the collector of the BipTr Q22 and its signal is input to the base of the BipTr Q24 constituting an emitter follower circuit which outputs the output signal EOUT from the emitter. Because of this, the BipTr Q25 or Q26 whose collector is connected to the collector of the BipTr Q21 or Q22 whose collector is on the low level side, is turned on so that it goes to the latched state and is capable of holding the data (for example, when the collector potential of the BipTr Q21 is at the low level, the BipTr Q25 is turned on, and its collector potential is held at the low level).

This kind of circuit configuration has been described in, for example, "Digest of Technical Papers, pp. 38–39, ISSCC, 1989".

One of the factors which determine the operating speed of a latch circuit using the conventional ECL current switch described in the above is the response speed of the common collector terminal. If this terminal fails to operate at high speed, it will become meaningless even if the driving capacity of the subsequent emitter follower is enhanced (not possible to achieve a high speed operation). However, the capacity of this terminal is increased because of its being connected to a current switch for latching, which becomes a factor for obstructing a high speed operation.

Moreover, there is still another problem that in example of circuit where many BipTr are used the area occupied by the latch circuit as a whole becomes large because of the large area of a single element of the BipTr.

When considering a recent trend in which synchronous circuits where register circuit employing two latch circuits are controlled by clocks used for input and output, multibit configurations in which the number of data input and output is increased, and the like are introduced, the above fact is becoming an important element of problems for determining the chip area.

SUMMARY OF THE INVENTION

An object of the present invention is, therefore, to provide a latch circuit which can achieve high speed in the through operation.

Another object of the present invention is to provide a latch circuit which can achieve reduction in the use area in a latch circuit handling small amplitude input signals.

To achieve these objects, the latch circuit of the present invention has a first bipolar transistor connected between a first node and a second node and having a base connected to a first input terminal, a second bipolar transistor connected between a third node and said second node and having a base connected to a second input terminal, a first resistive element connected between a first power supply line and said first node, a second resistive element connected between said first power supply line and said third node, a first MOS transistor connected between said first node and a fourth node and having a gate, a second MOS transistor connected between said third node and said fourth node and having a gate, a first current source connected to said second node and operating during a first period of time, a second current source connected to said fourth node and operating during a second period of time, a first signal transfer circuit coupled between said first node and the gate of said second MOS transistor, and a second signal transfer circuit coupled between said third node and the gate of said first MOS transistor.

Therefore, it is possible to improve operating speed, in terms of the delay time in the through state from the input to the output through an output emitter follower, by, for example, about 20% compared with the prior art.

At the same time, it is also possible to reduce the area in the layout, through the replacement of the BipTr elements in the current switch for latch operation with the MOSTr elements.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 1:
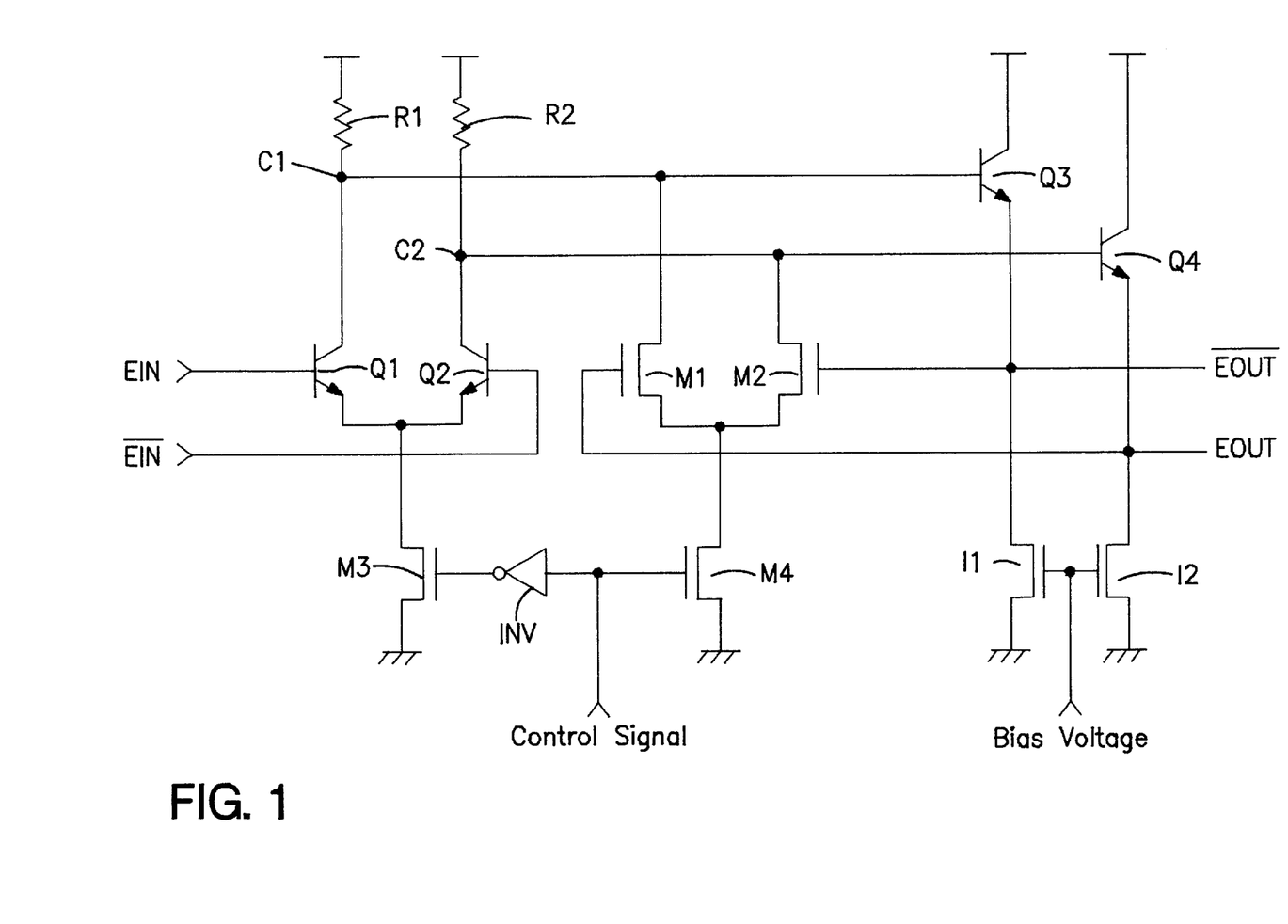
FIG. 1 is a circuit diagram showing the configuration of the first embodiment of the present invention.

A latch circuit according to first embodiment of the present invention is shown in FIG. 1.

Referring to FIG. 1, collectors C1 and C2 of BipTrs Q1 and Q2 receiving input signals EIN and EIN/ as base inputs, are connected to respective one ends of resistors R1 and R2 which have the respective other ends connected to a power Vcc on the high potential side as well as to the base of BipTrs Q3 and Q4 constituting an emitter follower circuit.

The emitter of the BipTrs Q3 and Q4 are connected to current sources I1 and I2, respectively, as well as to output terminals EOUT and EOUT/, and the emitters of the BipTrs Q3 and Q4 are input to the gates of N channel type MOSTrs M2 and M1, respectively. Each of current sources I1 and I2 is composed a MOSTr having a gate receiving a bias voltage for operating these MOSTrs at saturation mode.

In addition, the drains of the MOSTrs M1 and M2 are connected respectively to common nodes C1 and C2 that are connected respectively to load resistors R1 and R2.

A MOSTr M3 is connected to the common emitter of a current switch for through operation consisting of the BipTrs Q1 and Q2, and a MOSTr M4 is connected to the common source of a current switch for latch consisting of the MOSTrs M1 and M2.

The latch circuit is constituted by using the same BipTrs as in the prior are for the element which determine the operation speed, and by using MOSTrs for element not so important in view of the speed. Here, what is meant by an operation that demands high speed is one for which the delay time from input to output in the through state is required to be small.

In short, a BipTr current switch is used for through operation, but in a current switch for latch operation is replaced by a differential amplifier using MOSTrs. Besides, the current switching of these current switches is accomplished by the turning on/off of the gate signals for the MOSTrs connected as the respective current sources.

An operation control signal (clock signal) CLK of this latch circuit and the inverted signal of the clock signal obtained via an invertor INV are input to the gates of the MOSTrs M4 and M3, respectively.

Further, one of the MOSTrs M1 and M2, the drain of the MOSTr M1 which inputs by feedback the output signal EOUT to the gate is connected at a node C1 to the collector of the BipTr Q1 and is input to the base of the BipTr Q3, constituting an emitter follower, which outputs the output signal EOUT/ from the emitter. The drain of the MOSTr M2 which inputs by feedback the output signal EOUT/ to the gate is connected at a node C2 to the collector of the BipTr Q2 and is input to the base of the BipTr Q4, constituting the emitter follower, which outputs the output signal EOUT.

Next, the operation of the latch circuit will be described.

When the clock signal CLK being the signal for controlling the operation of the latch operation is at a low level, the MOSTr M4 is turned off and the MOSTr M3 is turned on, bringing the latch circuit to the through operation state.

The on-current of the MOSTr M3 is supplied to the current switch formed by the BipTrs Q1 and Q2, and one of the BipTrs Q1 and Q2 is turned on and the other is turned off in accordance with the potential difference between the inputs EIN and EIN/ at this time.

Now, assuming that the data input signal EIN is at the high level and the EIN/ is at the low level, the BipTr Q1 is turned on causing a current to flow in the resistor R1, bringing down the potential of the node C1 to the low level. On the other hand, since the BipTr Q2 is in the off-state, no voltage drop is caused by the resistor R2, bringing the potential of the node C2 to the high level Vcc of the power supply voltage.

The potential of the nodes C1 and C2 are dropped by about 0.8V by means of the emitter follower consisting of the BipTrs Q3 and Q4, and the output signals EOUT/ and EOUT are output as low level and high level, respectively.

If the potential difference between the nodes C1 and C2 at this time is called $\Delta V$, the voltage of the output signals EOUT/ and EOUT are represented by the following Eqs. (1-a) and (1-b).

$$EOUT = Vcc - 0.8[v] \tag{1-a}$$

$$EOUT/ = Vcc - 0.8[v] - \Delta V \tag{1-b}$$

Next, as the clock signal CLK goes to the high level the latch circuit goes to the latch operation state, whereby the MOSTr M4 is turned on and the MOSTr M3 is turned off and the on-current of the MOSTr M4 is supplied to the differential pair MOSTr M1 and M2. In that case, if the data output EOUT is at the high level and EOUT/ is at the low level, the MOSTr M1 is turned on and the MOSTr M2 is turned off, so that the current supply to the resistor R1 is maintained, the potential relationship is stable, with the potential of the node C1 kept at the low level, the potential of the node C2 kept unchanged at the high level bringing the circuit to the latch state.

However, in order for the circuit to enter the latch state in a stable manner, a condition somewhat different from that of the prior art BipTr current switch is required.

The condition is that the potential difference ΔV between the data outputs EOUT and EOUT/, being the gate inputs to the differential pair MOSTrs M1 and M3, has to be set at a slightly larger value. The reasons for this are the facts that a MOS differential amplifier has an inferior performance at a minute potential difference and has a larger variation of characteristics between the elements constituting differential pairs, compared with a BipTr amplifier. In other words, in contrast to the value of ΔV of about 0.2v or more for the BipTr, it is necessary to have about 0.4–0.5v or more for the MOSTr.

However, since the potential difference required as the output is determined by the circuits of the next and subsequent stage, the latch circuit of this embodiment mode is applicable to many examples except for the cases where small amplitudes on the other of 0.2–0.3v are absolutely necessary.

A high speed signal transmission is required for the path from the data inputs EIN and EIN/ to the data outputs EOUT and EOUT/ in the through state, and the operating speed in that case is strongly dependent of the output load capacitance and the additional capacitance of the nodes C1 and C2, under the condition of constant current amounts that are set by the MOSTr M3 and the current sources I1 and I2.

Since it is general that the output loads prove to be relatively large, the gate input capacitance of the MOSTrs M1 and M2 are not much influenced in compliance with that fact (similar situation applied also to the base input capacitance of the conventional latch circuit).

In contrast to this, the additional capacitance to the common terminals C1 and C2 are dependant on the collector terminals, base terminals and resistors, and are determined by the elements constituting the circuit. Among these, the collector terminal has a large area so that the P-N junction capacitance due to it is large which dominates most part of the load capacitance of the terminal C1 or C2.

This embodiment has an operational effect that it is possible to reduce the additional capacitance to the nodes C1 and C2 because of the fact that the number of the collector terminals used is one in comparison to two in the conventional circuit.

Figure 6:
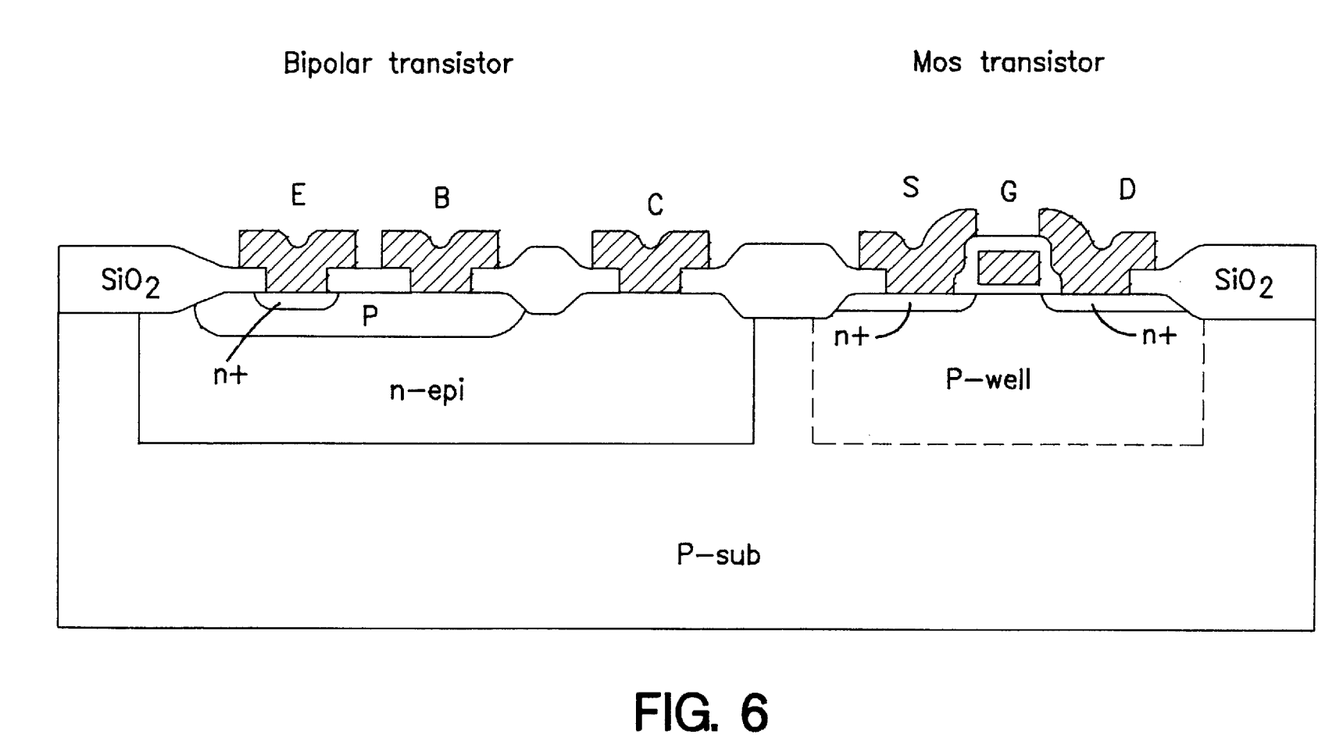
FIG. 6 is a diagram showing the sectional structure of a bipolar transistor and a MOS transistor.

In FIG. 6 is shown a representative sectional view of the BipTr and MOSTr. The collector region of the BipTr covers a large region formed so as to enclose the base and emitter diffused regions, and its capacitance is represented as a junction capacitance between the collector N-epaxial layer (N-epi) and the substrate P-sub as well as the P region of the base.

In contrast, the drain region of the MOSTr is only the small region of the N+ diffused layer formed in the vicinity of the substrate surface, and this is due to the face that the MOSTr is formed only in the vicinity of the substrate surface beneath the gate (G) and that the area of the drain has a predominant purpose as a region for taking out of electrical contact with the surface.

For example, a comparison of the two elements for the size (with equal current consumptions) employed for a latch circuit of BiCMOS fabrication technology of design rule of 0.6 micron class, reveals that the drain capacitance of the MOSTr was about 15 fF in contrast to about 120 fF of the collector capacitance of the BipTr.

This reduction in the capacitance value contributes to an improvement of the response speed of the nodes C1 and C2 in the latch circuit in FIG. 1, realizing an improvement of about 20% of the delay time.

In addition, since the area of the element as a whole of the BipTr is large, it is possible to reduce the area of the latch circuit as a whole by replacing it with the MOSTr. The reason for capable of obtaining a smaller area is the difference in the areas of the collector and the drain regions.

When compared for the latch circuit as a whole, it is possible to reduce the area by about 10–30% compared with the prior art latch circuit. The effect of this area reduction induces a reduction in the length of the connection wiring so that the propagation delay of signals due to wiring capacitance can also be improved (reduced).

Next, a second embodiment of the present invention will be described, referring to FIG. 2.

Figure 2:
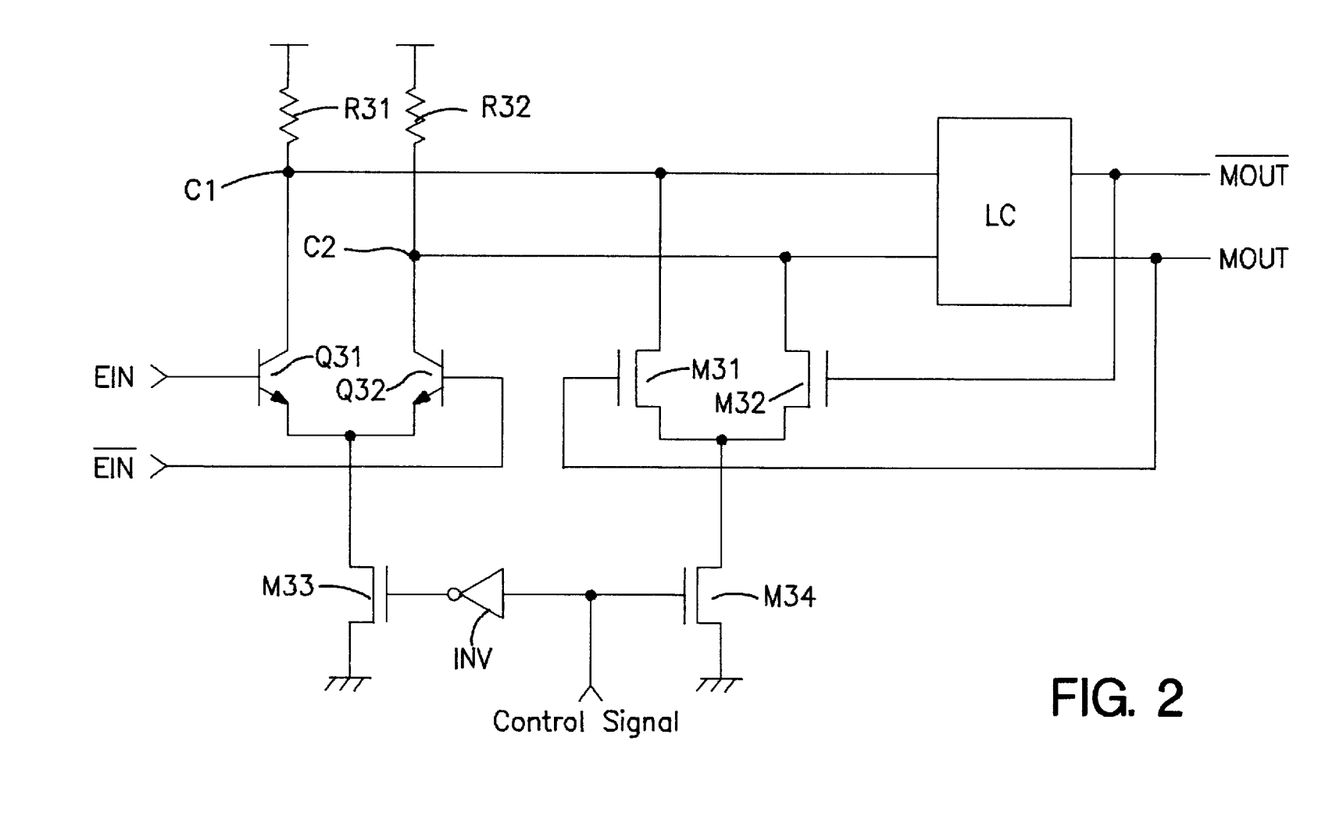
FIG. 2 is a circuit diagram showing the configuration of the second embodiment of the present invention.
Figure 7:
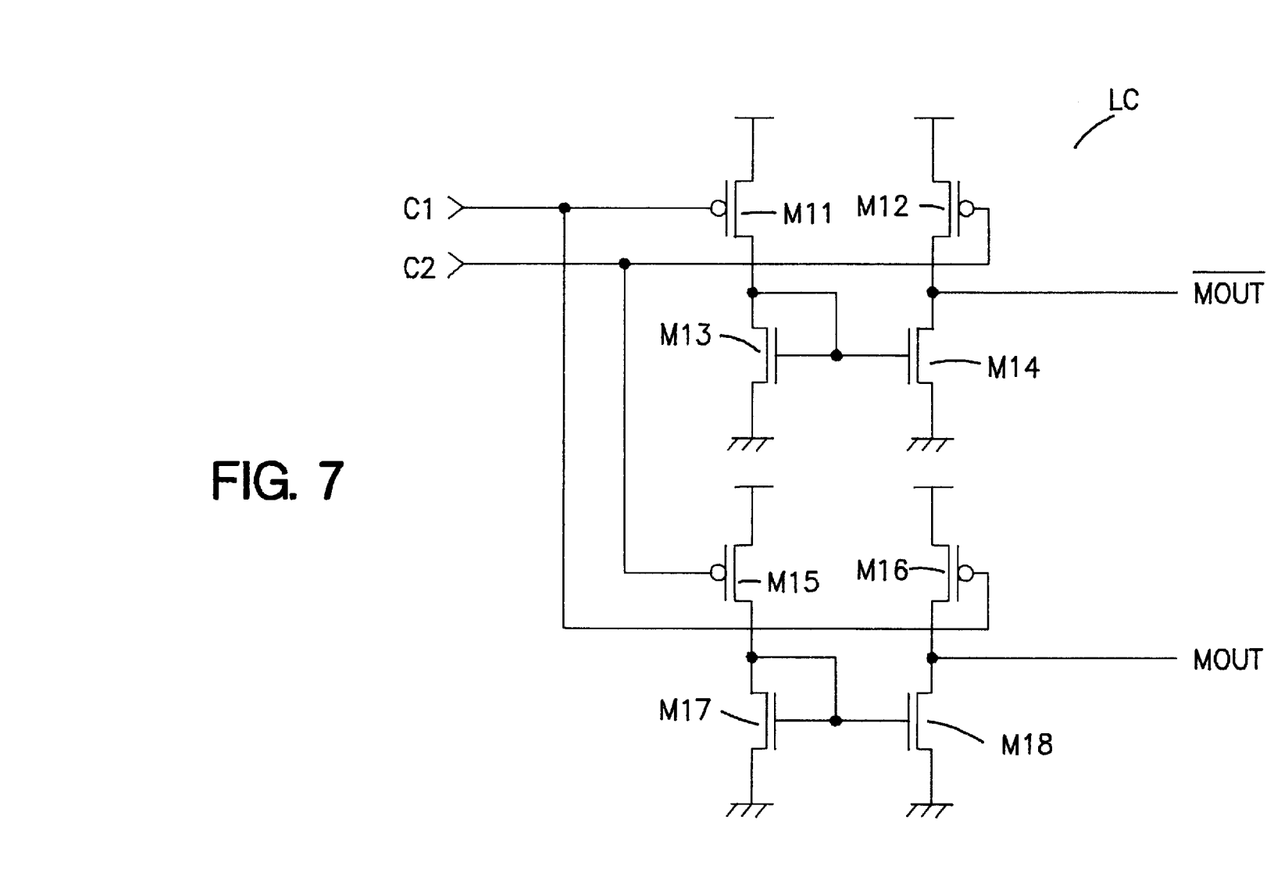
FIG. 7 is a circuit diagram showing the configuration of the level convertor of the second embodiment.

As showing in FIG. 2, in place of the emitter follower circuit having the nodes C1 and C2 as inputs in the latch circuit according to the first embodiment, a level converter circuit LC is connected to the nodes C1 and C2, and output signals MOUT and MOUT/ amplitudes are extended to the signal level of the MOSTr are used as the outputs. The circuit structure of the level converter circuit LC is shown in FIG. 7. The circuit LC is comprised a P channel type MOSTr (PMOSTr) M11, a PMOSTr M12, an N channel type MOSTr (NMOSTr) M13, an NMOSTr M14, a PMOSTr M15, a PMOSTr M16, an NMOSTr M17, and NMOSTr M18. Each of PMOSTr is connecting to one of the nodes C1 and C2, and each of PMOSTr operates a load element for control a current. NMOSTrs M13 and M14 and NMOSTrs M17 and M18 are connected as current miller circuit. Such as level converter circuit LC receives ECL level and outputs COMS level in response to the inputted ECL level. This embodiment which serves as a circuit for handling signals of MOSTr level in the next state circuit (not shown), and in that case, the output signals MOUT and MOUT/ are used as signals fed back to the gates of the MOSTr differential pair M31 and M32 for latching. In that case, a large value can be secured as the gate potential difference of the MOS differential pair M31 and M32 without depending on the potential amplitude difference ΔV of the nodes C1 and C2, so that the requirement of setting the output amplitude difference ΔV at somewhat large value described in the first embodiment can be made unnecessary.

Figure 3:
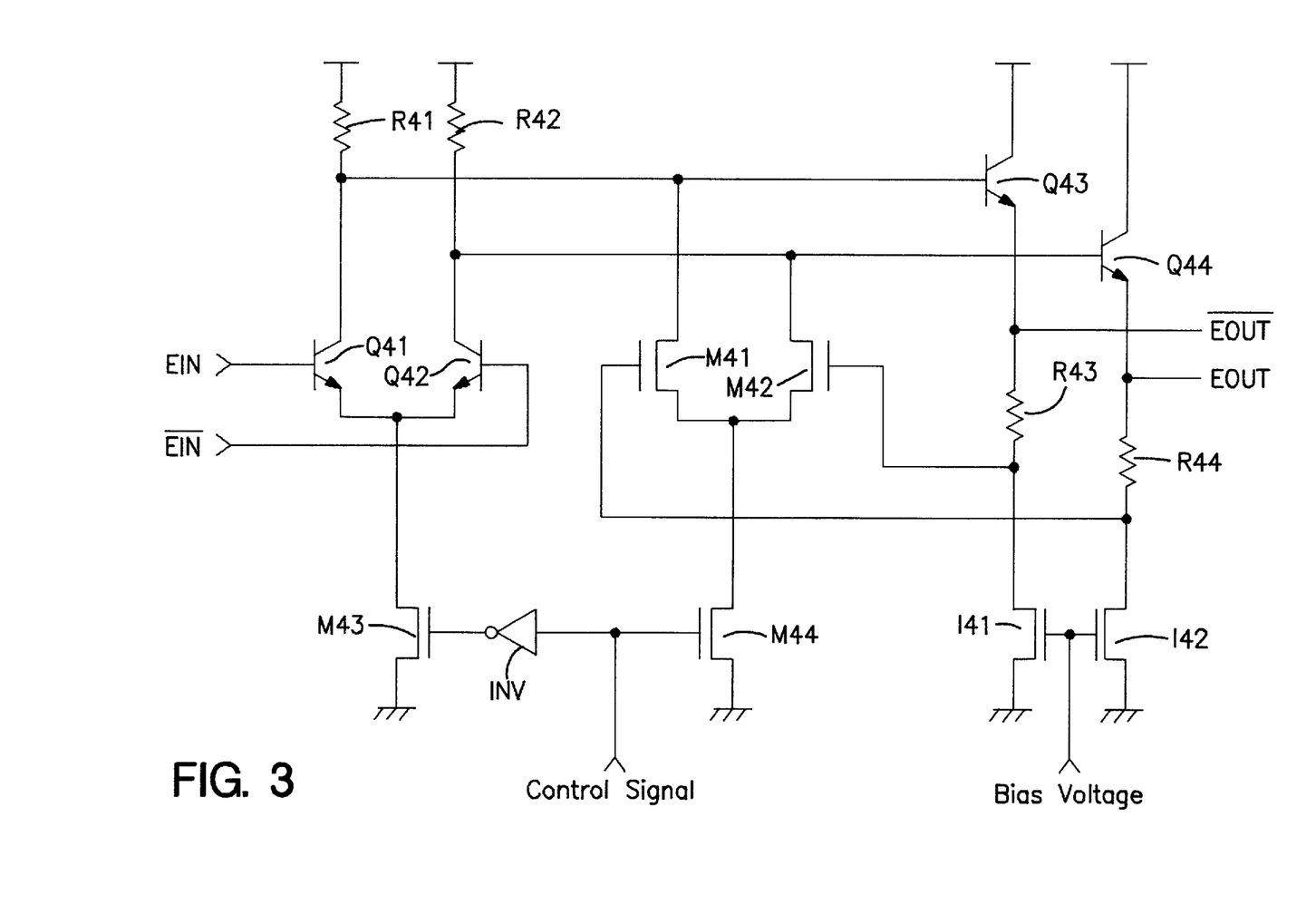
FIG. 3 is a circuit diagram showing the configuration of the third embodiment of the present invention.

Next, referring to FIG. 3, a third embodiment of the present invention will be described. As shown in FIG. 3, the latch circuit is obtained by respectively inserting resistors R43 and R44 between the output terminals EOUT/ and EOUT and the constant current sources I41 and I42 in the emitter follower circuit of the latch circuit in the first embodiment, and inputting output signals with voltages dropped by going through the resistors R43 and R44 to the respective gates of M42 and M41 of MOS differential pair for latch. Each of current sources I41 and I42 is composed a MOSTr having a gate receiving the bias voltage for operating these MOSTrs in the saturation mode.

By lowing the gate voltage of the MOS differential pair M42 and M41 by means of resistors as in the above, it is possible to enhance the amplification capacitance of the MOS differential pair M42 and M41 under the condition of constant signal potential difference.

This is because the difference between the capacitance (current driving capacitance) of two MOSTrs constituting the differential pair becomes large, and by so doing it becomes possible to reduce the output amplitude ΔV. However, if the gate voltage is lowered excessively, then the drain voltage of a current source M44 for latch operation drops excessively, reducing the current flow rate, which results in the narrowing of the signal amplitude itself to below a design value. For this reason, the resistance values of the resistors R43 and R44 are set to optimize the gate voltages.

Figure 4:
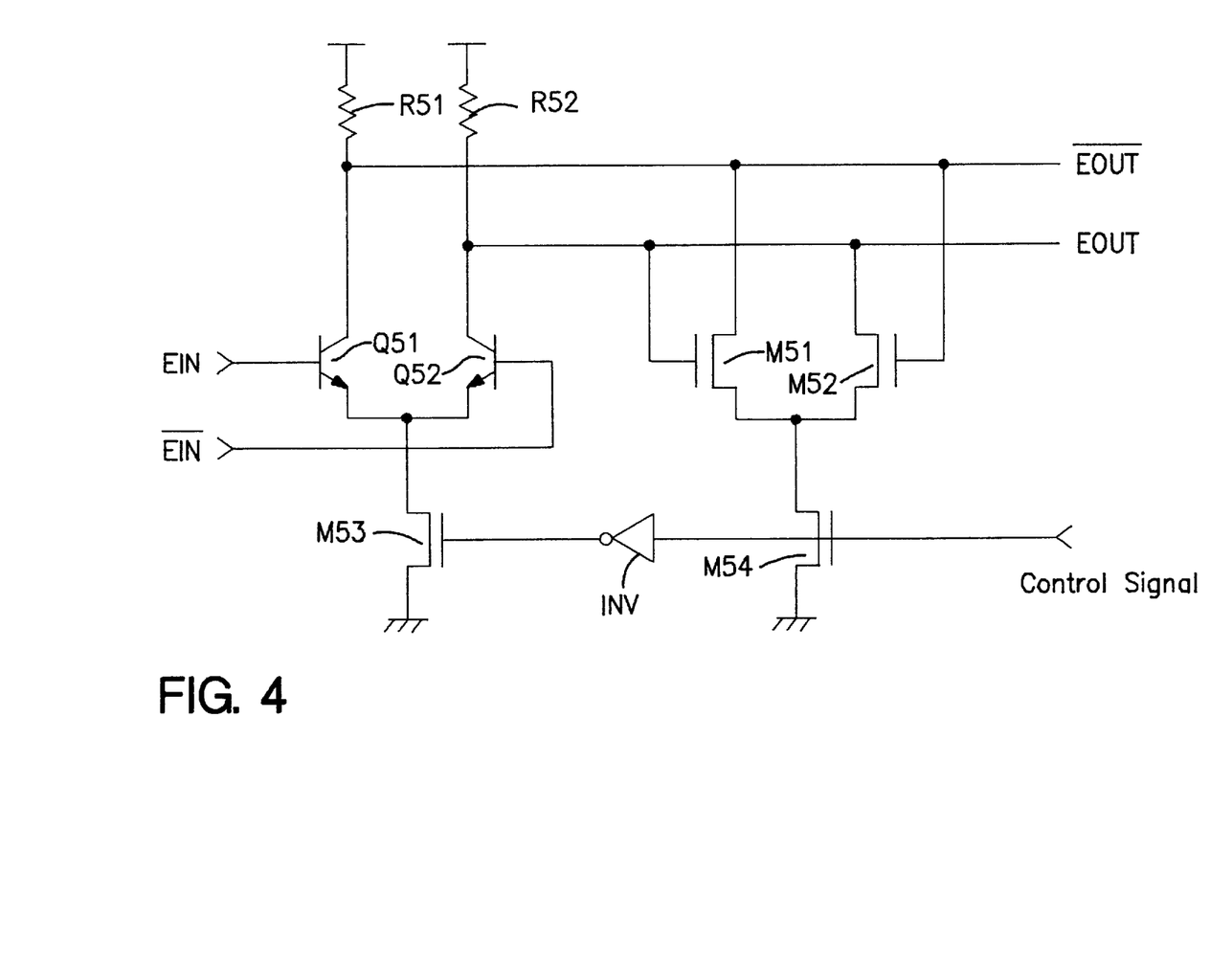
FIG. 4 is a circuit diagram showing the configuration of the fourth embodiment of the present invention.

Next, referring to FIG. 4, a fourth embodiment of the present invention will be described. The latch circuit deletes the emitter follower circuit in the latch circuit according to the first embodiment, and the nodes C1 and C2 are connected to the data outputs EOUT/ and EOUT.

In addition, the gates of a MOSTr differential pair M51 and M52 for latch operation are supplied with the data outputs EOUT nd EOUT/.

In this embodiment, the emitter follower formed of the BipTrs is eliminated so that it is disadvantageous when the output load capacitance are large, but it will make it possible to reduce the number of elements and the current consumption if the loads are relatively small.

Figure 5:
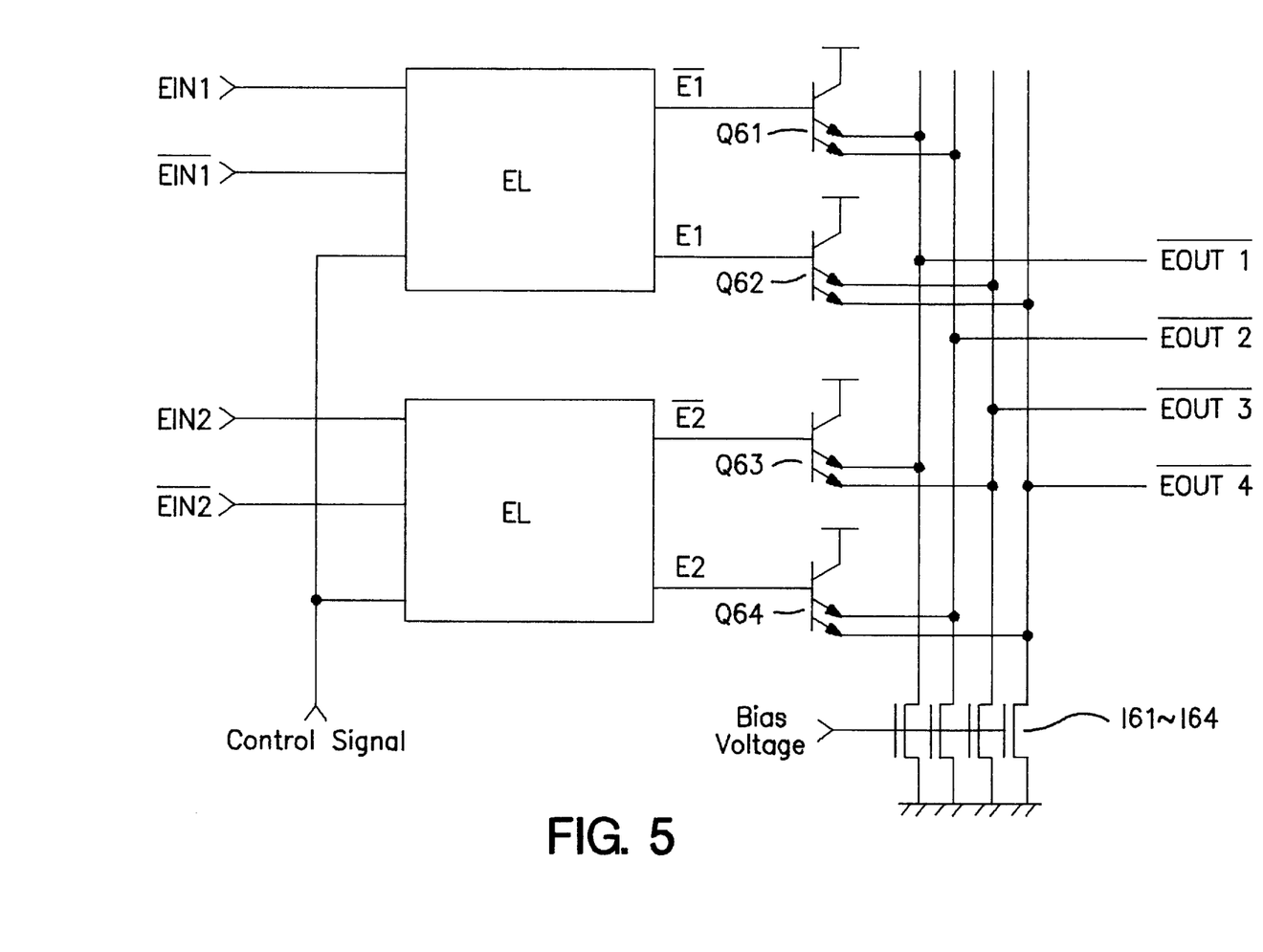
FIG. 5 is a circuit diagram showing the configuration of the fifth embodiment of the present invention.

Referring to the FIG. 5, a fifth embodiment of the present invention will be described. This embodiment is provided with two latch circuit EL according to the fourth embodiment mode described with reference to FIG. 4, where a control signal CLK is supplied in common to these latch circuit, separate data inputs EIN1 and EIN1/, and EIN2 and EIN/ are input respectively to the two latch circuits, and E1/ and E1, and E2/ and E2 are output from the two latch circuits.

These outputs E1/ and E1, and E2/ and E2 are input respectively to an emitter follower circuit consisting of double emitter type BipTrs Q61–Q64, forming a wired-OR logic circuit according to the combinations of positive and negative logic, producing outputs EOUT1–EOUT4 of the emitter follower circuit where only one out of the four outputs is set at low level while the remaining three are set at high level according to the combination of the input signals.

This decoder circuit operation is the operation in the through state when the control signal CLK is at the low level, and when the control signal CLK is at the high level, the input signals are latched by respective latch circuits so that the decoder output is also fixed.

The current sources for the wired-OR circuit are the four of I61–I64 which equal the sources for two of the conventional latch circuits. These current sources I61–I64 are also composed MOSTrs and each of gates receiving the bias voltage for operating these MOSTrs in the saturation mode. Namely, according to this embodiment, it is possible to realize the operational effect of incorporating a decoder circuit into a latch circuit without increasing the current consumption.

As described in the above, it is possible to accomplish an enhancement of operating speed, in terms of the delay time in the through state from the input to the output through an output emitter follower, by, for example, about 20% compared with the prior art.

At the same time, according to the present invention, it is also possible to reduce the area in the layout, through the replacement of the BipTr elements in the current switch for latch operation with the MOSTr elements.

Moreover, according to the present invention, it becomes possible to reduce the number of elements and the current consumption by deleting the emitter follower and directly inputting the common nodes to the gates of the MOSTrs for latching. Furthermore, it is readily possible to constitute a decoder circuit with latch which con suppress the increase in the current consumption by, for example, combining the latch circuit according to the present invention with a wired-OR logic circuit formed of BipTrs.

I claim:

1. A semiconductor circuit comprising:
    a first bipolar transistor connected between a first node and a second node and having a base connected to a first input terminal;
    a second bipolar transistor connected between a third node and said second node and having a base connected to a second input terminal;
    a first resistive element connected between a first power supply line and said first node;
    a second resistive element connected between said first power supply line and said third node;
    a first MOS transistor connected between said first node and a fourth node and having a gate;
    a second MOS transistor connected between said third node and said fourth node and having a gate;
    a first current source connected to said second node and operating during a first period of time;
    a second current source connected to said fourth node and operating during a second period of time;
    a first signal transfer circuit coupled between said first node and the gate of said second MOS transistor; and
    a second signal transfer circuit coupled between said third node and the gate of said first MOS transistor.

2. The circuit as claimed in claim 1, wherein said first signal transfer circuit has a third bipolar transistor connected between said first power supply line and a first output terminal and having a base connected to said first node, and a third MOS transistor connected between said first output terminal and a second supply line and having a gate receiving a bias voltage, and said second signal transfer circuit has a fourth bipolar transistor connected between said first power supply line and a second output terminal and having a base connected to said third node, and a fourth MOS transistor connected between said second output terminal and said second supply line and having a gate receiving said bias voltage.

3. The circuit as claimed in claim 1, wherein said first signal transfer circuit has a third bipolar transistor connected between said first power supply line and a first output terminal and having a base connected to said first node, a third resistive element connected between said first output terminal and a fifth node, a third MOS transistor connected between said fifth node and a second supply line and having a gate receiving a bias voltage, and said second signal transfer circuit has a fourth bipolar transistor connected between said first power supply line and a second output terminal and having a base connected to said third node, a fourth resistive element connected between said second output terminal and a sixth node, a fourth MOS transistor connected between said sixth node and said second supply line and a gate receiving said bias voltage.

4. The circuit as claimed in claim 1, wherein said first current source has a third MOS transistor connected between said second node and a second supply line and having a gate receiving an inverted control signal, said second current source has a fourth MOS transistor connected between said fourth node and said second supply line and having a gate receiving said control signal.

5. The circuit as claimed in claim 1, wherein said first signal transfer circuit has a third MOS transistor of a first conductive type connected between said first power supply line and a fifth node and having a gate connected to said first node, a fourth MOS transistor of a second conductive type connected between said fifth node and a second power supply line and having a gate connected to said fifth node, a fifth MOS transistor of said first conductive type connected between said first power supply line and a first output terminal and having a gate connected to said third node, a sixth MOS transistor of said second conductive type connected between said first output terminal and said second power supply line and having a gate connected to said fifth node, and said second signal transfer circuit has a seventh MOS transistor of said first conductive type connected between said first power supply line and a sixth node and having a gate connected to said third node, an eighth MOS transistor of said second conductive type connected between said sixth node and said second power supply line and having a gate connected to said sixth node, a ninth MOS transistor of said first conductive type connected between said first power supply line and a second output terminal and having a gate connected to said first node, and a tenth MOS transistor connected between said second output terminal and said second power supply line and having a gate connected to said sixth node.

* * * * *

UNITED STATES PATENT AND TRADEMARK OFFICE
CERTIFICATE OF CORRECTION

PATENT NO.   : 5,877,642
DATED        : March 2, 1999
INVENTOR(S)  : Hiroyuki TAKAHASHI It is certified that error appears in the above-indentified patent and that said Letters Patent is hereby corrected as shown below:

On the cover page, in Item [30], change 6-323627 to 7-323627.

Signed and Sealed this

Twenty-ninth Day of June, 1999

Attest:

Q. TODD DICKINSON

*Attesting Officer*   Acting Commissioner of Patents and Trademarks